United States Patent [19]
Lo et al.

[11] Patent Number: 6,165,413
[45] Date of Patent: Dec. 26, 2000

[54] METHOD OF MAKING HIGH DENSITY SPUTTERING TARGETS

[75] Inventors: Chi-Fung Lo, Fort Lee, N.J.; Darryl Draper, Congers; Paul S. Gilman, Suffern, both of N.Y.

[73] Assignee: Praxair S.T. Technology, Inc., Danbury, Conn.

[21] Appl. No.: 09/349,666

[22] Filed: Jul. 8, 1999

[51] Int. Cl.⁷ .................................................... B22F 3/15

[52] U.S. Cl. .................................................. 419/49; 49/53

[58] Field of Search ........................................ 419/49, 53

[56] References Cited

U.S. PATENT DOCUMENTS

| | | | |
|---|---|---|---|
| 4,612,162 | 9/1986 | Morgan et al. | 419/28 |
| 4,838,935 | 6/1989 | Dunlop et al. | 75/230 |
| 5,248,474 | 9/1993 | Morgan | 419/28 |
| 6,010,583 | 1/2000 | Annavarapu et al. | 148/513 |

*Primary Examiner*—Ngoclan Mai
*Attorney, Agent, or Firm*—Blake T. Biederman

[57] ABSTRACT

There is provided a method for fabricating high density sputter targets by pre-packing a powder bed by hot pressing or vibration between metal plates, followed by hot isostatic pressing. This method is especially suitable for preparing sputter targets with a radius to thickness ratio of at least 3 and a density of at least 96% of theoretical.

25 Claims, 1 Drawing Sheet

METHOD OF MAKING HIGH DENSITY SPUTTERING TARGETS

FIELD OF THE INVENTION

This invention relates to the fabrication of high density sputtering targets having a large radius/thickness ratio.

BACKGROUND OF THE INVENTION

In the manufacture of sputter targets used in the semiconductor industry, and more particularly to sputter targets used in physical vapor deposition (PVD) of thin films onto complex integrated circuits and other electronic components, it is desirable to produce a sputter target that will provide film uniformity, minimal particle generation during sputtering, and desired electrical properties. Furthermore, to meet the reliability requirements for diffusion barriers or plugs of complex integrated circuits, the sputter target must have high density.

Current methods to achieve suitable sputter targets from powder materials for use in complex integrated circuits involve either hot pressing or cold isostatic pressing followed by high temperature sintering. Using either of these techniques, the density of the pressed target material is about 90% of theoretical density. By way of example, to obtain that 90% density for a tungsten-base target, the sintering process needs to proceed at a minimum temperature of 1800° C. This high temperature results in a significant growth of the grains. Large grain size in sputter targets is deleterious to the uniformity of the deposited films. Thus, the sputter targets fabricated by the hot press or cold isostatic press followed by high temperature sintering have proved unreliable for use in complex integrated circuits.

Another well-known technique for achieving high density for powder products is hot isostatic pressing (HIPing). With the HIPing process, the powder packing density is normally increased from the range of 30%–50% to the range of 96%–100%. Due to significant shrinkage of the volume of the powder bed, the starting dimensions of the powder bed may not be evenly reduced by this HIPing technique. Moreover, uneven packing of the starting powder bed is very easily distorted during HIPing, especially when the ratio of radius to thickness is greater than about 3.0.

One trend in the semiconductor industry to increase production yield is to increase the size of the semiconductor wafer onto which the thin film is to be deposited. New processing is available to increase wafer sizes from 8 inches to 12 inches. This requires a proportional increase in the diameter of the sputtering targets from about 12 inches to about 20 inches, which results in an increase in the ratio of target radius to target thickness. Unfortunately, using HIPing, the greater the ratio of target radius to thickness, the easier the disk-shaped targets are distorted. To alleviate the distortion problem, one approach is to increase the powder bed density by cold isostatic pressing prior to HIPing. A second approach is to reduce the ratio of radius to thickness for the starting powder bed by increasing the thickness. The cold isostatic pressing step will increase the powder packing density from about 20–30% to about 50–60%. However, as with HIPing, cold isostatic pressing also generates significant distortion to the powder bed when the ratio of radius to thickness is greater than about 3. Therefore, to obtain the desired dimensions and shapes for the sputtering target, more powder is required by using cold plus hot isostatic pressings. The powder materials used for electronic or semiconductor applications are typically expensive due to their high purity requirements. Accordingly, the additional cold isostatic pressing process, plus the extra amount of expensive powder, significantly raises the production cost. The second approach, increasing the target thickness, also increases the cost due to the increase in powder material needed for target production.

There is thus a need to develop a method for fabricating high-density sputtering targets with large radius to thickness ratios that meet the reliability requirements for complex integrated circuits, and yet are not prohibitively expensive to manufacture.

SUMMARY OF THE INVENTION

The present invention provides a sputtering target having a radius to thickness ratio of at least about 3 and a density of at least 96% of theoretical density. To this end, and in accordance with the principles of the present invention, a powder material is hot pressed to obtain about 50–95% of theoretical density, followed by HIPing, to achieve a minimum density of about 96% of theoretical density. Hot pressing does not distort the powder bed, and the HIPing technique does not cause large grain growth.

In an alternative embodiment of the present invention, a powder material is hot pressed to less than 50% of theoretical density, loaded between opposing metal plates in a HIPing capsule, and subsequently HIPed to achieve a minimum density of about 96% of theoretical density. The metal plates keep the top and bottom target surfaces flat, thus preventing distortion of the powder bed during HIPing.

In yet another alternative embodiment of the present invention, a powder bed which has not been pre-packed is loaded between opposing metal plates in a HIPing capsule, vibrated, and subsequently HIPed. Again the metal plates keep the top and bottom surfaces flat to prevent distortion of the powder bed during HIPing.

These and other objects and advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

The present invention provides a method for fabricating high density sputter targets having a high radius/thickness ratio, whereby distortion of the sputter target is avoided during compaction from the starting powder material to the highly dense final sputter target.

Figure 1:
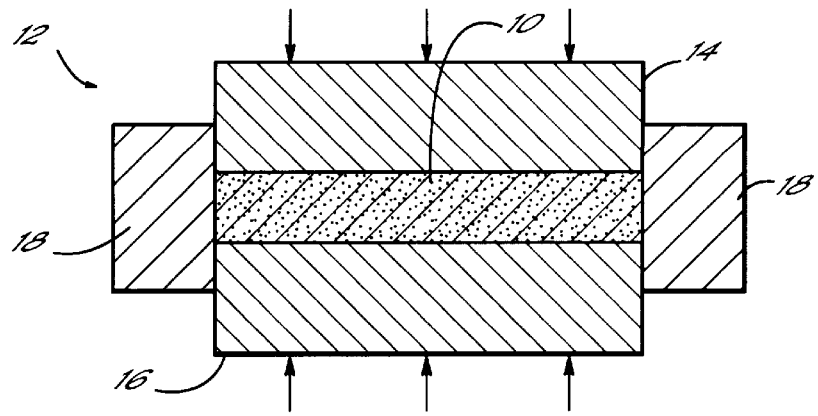
FIG. 1 is a diagrammatic cross-section depicting the hot pressing step of a first embodiment of the present invention.

Referring to FIG. 1, a powder bed 10 is placed in a press die apparatus 12 which comprises upper and lower press dies 14,16, respectively, and at least one side press die 18. The powder bed 10 comprises particles of any metal or alloy suitable as a sputter target material, and ultimately a physical vapor deposited thin film. By way of example only and not limitation, suitable materials include: Ti—Al alloys, Cr—Cu alloys, W—SiN alloys, Ta—Al alloys, Co—Cr alloys, and silicides. The powder bed material preferably includes particles with an average particle size of about 0.5 $\mu$m to about 150 $\mu$m. The powder bed 10 is then hot pressed at a temperature ranging between about ½ the melting point of the metal or alloy to about 100° less than the melting point and under a pressure of about 0.5 ksi to about 3.0 ksi for about 1 to about 8 hours in a controlled atmosphere by pressing the upper and lower press dies 14,16 toward each other, as shown by the arrows, to compact the powder bed, while containing the sides of the powder bed by the stationary side press die 18. The controlled atmosphere is a vacuum, reducing gas or inert gas, or a combination thereof. The resulting pressed target blank 20 has a sintered density between about 50% to about 95% of theoretical density and a ratio of radius to thickness greater than about 3. The shape of the pressed target blank is more uniform and closer to the final target configuration than that of a cold isostatic pressed target blank. More importantly, the target blank does not suffer distortion during hot pressing.

Figure 2:
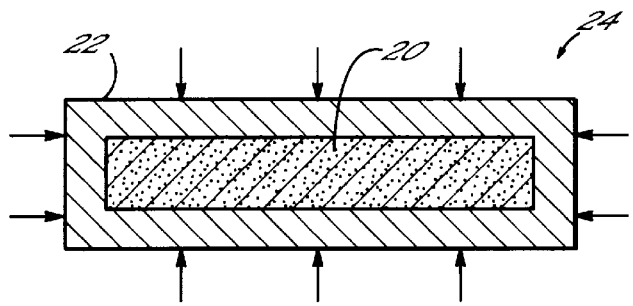
FIG. 2 is a diagrammatic cross-section depicting the hot isostatic pressing step of the first embodiment of the present invention.

Referring to FIG. 2, the hot pressed target blank 20 is loaded into a metal capsule 22, which is then sealed and evacuated. The target blank is HIPed, as shown by the arrows, at a temperature in the range of about 1000° C. to about 1600° C. at a pressure higher than about 15 ksi for a period of at least 3 hours in an inert environment such as argon. The pressure of the HIP apparatus 24 is preferably about 40 ksi. At these preferred temperatures and pressures the HIPing step is preferably performed for about 7 hours. The HIPing temperatures are lower than in high temperature sintering, thus minimizing large grain growth.

The capsule material must be capable of substantial deformation due to the high pressure and volume reduction characteristic of the HIPing technique. Furthermore, the capsule material must have a melting point higher than the HIPing temperature. Thus, any material of sufficiently high melting point that can withstand the degree of deformation caused by the HIPing process is suitable for the present invention. Suitable materials may include, for example, beryllium, cobalt, copper, iron, molybdenum, nickel, titanium or steel.

The metal capsule 22 preferably has a wall thickness between about 0.03 inch and about 0.2 inch. Capsule wall thicknesses less than 0.03 inch are subject to collapse during deformation, and thicknesses greater than about 0.2 inch are difficult to uniformly deform. By the HIPing process, a near net-shaped target blank is achieved having at least 96% of theoretical density and a radius to thickness ratio of at least about 3. Again, no distortion to the target occurs during the HIPing process. By near net-shaped is meant close to final target dimensions with only minimal final machining needed. This is advantageous from a cost perspective, given that extensive machining wastes a larger amount of the very expensive materials used for sputter targets. As a result of the hot pressing plus hot isostatic pressing, about 20% to 40% of powder material is saved as compared to prior art attempts for producing large radius to thickness ratio targets.

Figure 3:
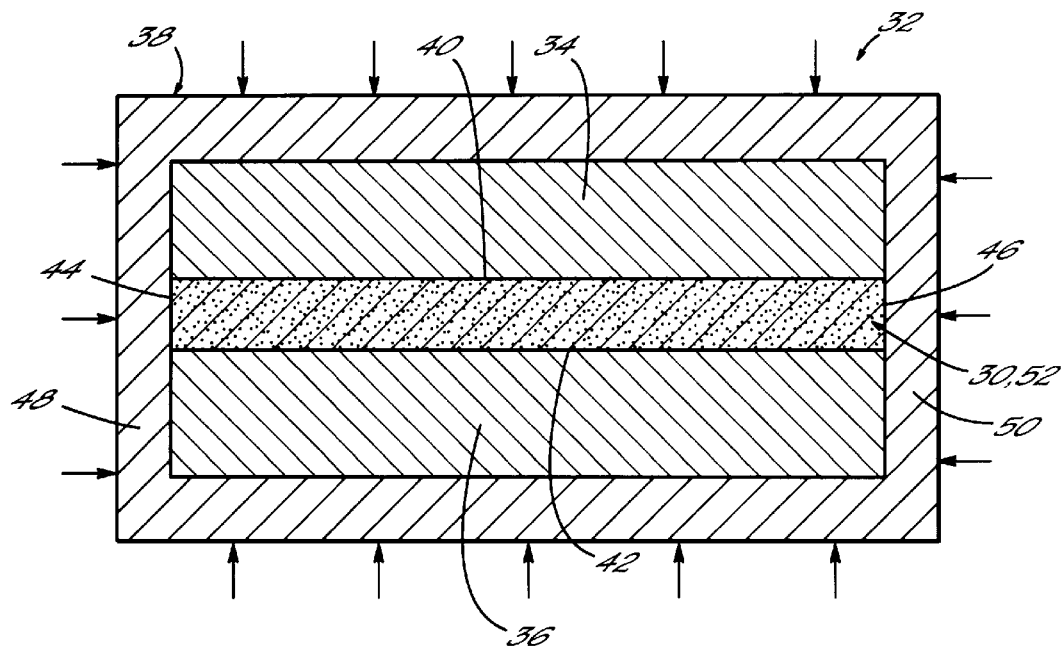
FIG. 3 is a diagrammatic cross-section depicting the hot isostatic pressing step of a second and third embodiment of the present invention.

Referring to FIGS. 1 and 3, there is provided an alternative embodiment of the present invention. In this embodiment, the powder bed 10 is hot pressed as in FIG. 1, but a density of only 50% or less may be achieved. Some powder materials will not pack to higher densities by the hot pressing method. This low density pressed target blank 30 is then loaded into the HIP apparatus 32 of FIG. 3. The pressed target blank 30 is placed between two metal plates 34,36 inside a HIPing capsule 38, which is then sealed and evacuated. The pressed target blank 30 is then HIPed under the same conditions as described in the previous embodiment. The metal plates 34,36 keep the target blank surfaces 40,42 flat during the HIPing process. The metal plates may be titanium, low carbon steel or any other metal sufficient to sustain the HIPing temperature and pressure, and preferably have a thickness of about 0.3 inch to about 0.6 inch. The metal plates 34,36 resist deformation, but the sides 44,46 of the target blank 30 are not confined by metal plates and are thus subject to heavier deformation during HIPing. Thus, a certain degree of necking tends to occur at the side walls 44,46. The thicker the target blank, the greater the degree of necking that occurs, which presents a risk that the target material will fracture due to the material exceeding its fracture or elongation limitation. Thus, for this embodiment, the radius to thickness ratio is preferably at least 5. With this higher ratio of radius to thickness, the pressed target blank 30 will be pressed faster in the vertical direction than in the radial direction thus avoiding collapse of the side walls 48,50 of the metal capsule 38 near the side walls 44,46 of the target blank. To further avoid collapse of the capsule side walls 48,50, the wall thickness is preferably greater than about 0.07 inch. By this method, a sputter target is formed having a density of at least 96% of theoretical density and a radius to thickness ratio of at least 5.

Referring to FIG. 3, there is provided yet another alternative embodiment of the present invention. A packed target blank 52, which has not been hot pressed as in FIG. 1, is prepared by pouring a powder material, as described above for powder bed 10, between metal plates 34,36 in metal capsule 38 while the capsule is vibrated, such that a packing density in the range of about 30% to about 50% is obtained. After vibration, the metal capsule is sealed and evacuated and the packed target blank 52 is HIPed under the same conditions as described in the previous two embodiments. The metal plates are used to keep the target blank flat during vibration and during the subsequent HIPing. Again, when using the metal plates during HIPing, the radius to thickness ratio is preferably at least about 5 to avoid fracture from excessive necking. Thus, this embodiment provides a method for achieving high density sputter targets with high radius/thickness ratios, while avoiding target distortion.

Thus, the embodiments of the present invention provide methods for fabricating sputter targets from powder material, where the sputter targets have a high density and a large radius to thickness ratio which are suitable for sputtering thin film coatings on complex integrated circuits. Furthermore, the methods of the present invention use lower temperatures than previous methods, which avoids grain growth of the target material, thus improving uniformity of deposited films. Moreover, the principles of the present invention may be used for most any sputter target materials in which the starting material is in powder form.

EXAMPLES

Example 1

A pre-blended 70 atomic % W/30 atomic % $Si_3N_4$ powder having an average particle size of 10 $\mu$m was hot pressed at 1600° C. under 1 ksi for 3 hours. The pressed target blank size was 5.5 inches diameter and 0.5 inch thickness. The pressed target blank had a density of 70% of theoretical density and a flatness variance of ±0.001 inch on both the top and bottom surfaces. The pressed target blank was then placed in a titanium capsule, evacuated, and sealed. The pressed target blank was then hot isostatically pressed at 1350° C. under 30 ksi for 5 hours. The density of the near net-shaped target blank was 99% of theoretical density, and the target had a flatness variance of ±0.005 inch on both the top and bottom surfaces.

Example 2

A pre-blended 70 atomic % W/30 atomic % $Si_3N_4$ powder having an average particle size of 10 μm was hot pressed at 1500° C. under 1 ksi for 3 hours. The pressed target blank size was 5.5 inches diameter and 0.7 thickness, and the density was 50% of theoretical density. The flatness variance of the pressed target blank was ±0.001 on both the top and bottom surfaces. The pressed target blank was then placed in a titanium capsule, sandwiched between two 5.5 inch diameter by 0.5 inch thick titanium plates, and sealed after evacuation. The sandwiched pressed target blank was then hot isostatically pressed at 1350° C. under 30 ksi for 5 hours. The density achieved was 99% of theoretical density, with a near net-shaped target flatness of ±0.005 inch on both the top and bottom surfaces.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, the principles of the present invention may be used to fabricate sputter targets from any powder material. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of fabricating high density sputter targets, comprising the steps of:
   hot pressing a powder bed to achieve a pressed target blank having a packing density of greater than about 50% of theoretical and a ratio of radius to thickness of at least about 3; and
   hot isostatic pressing the pressed target blank in a metal capsule to achieve a near net-shaped sputter target having a density of at least 96% of theoretical and a ratio of radius to thickness of at least about 3.

2. The method of claim 1, wherein the powder bed is hot pressed at a temperature ranging between about ½ the melting point of the powder bed material to about 100° below the melting point.

3. The method of claim 1, wherein the powder bed is hot pressed at a pressure of about 0.5 to about 3 ksi.

4. The method of claim 1, wherein the powder bed is hot pressed for about 1 hour to about 8 hours.

5. The method of claim 1, wherein the powder bed is hot pressed at a temperature ranging between about ½ the melting point of the powder bed material to about 100° below the melting point, and at a pressure of about 0.5 to about 3 ksi for about 1 hour to about 8 hours.

6. The method of claim 1, wherein the pressed target blank is hot isostatic pressed at a temperature between about 1000° C. to about 1600° C. and a pressure of at least about 15 ksi for at least about 3 hours.

7. The method of claim 1, wherein the metal capsule has a wall thickness between about 0.03 inch and about 0.2 inch.

8. The method of claim 1, wherein the powder bed material is selected from the group consisting of: Ti—Al alloys, Cr—Cu alloys, W—SiN alloys, Ta—Al alloys, Co—Cr alloys, and suicides.

9. The method of claim 1, wherein the average particles size of the powder bed material is in the approximate range of about 0.5 μm to about 150 μm.

10. A method of fabricating high density sputter targets, comprising the steps of:
    hot pressing a powder bed to achieve a pressed target blank having a packing density of about 30% to about 50% of theoretical and a ratio of radius to thickness of at least about 5;
    loading the pressed target blank between two metal plates in a metal capsule; and
    hot isostatic pressing the pressed target blank in the metal capsule to achieve a near net-shaped sputter target having a density of at least 96% of theoretical and a ratio of radius to thickness of at least about 5.

11. The method of claim 10, wherein the powder bed is hot pressed at a temperature ranging between about ½ the melting point of the powder bed material to about 100° below the melting point.

12. The method of claim 10, wherein the powder bed is hot pressed at a pressure of about 0.5 to about 3 ksi.

13. The method of claim 10, wherein the powder bed is hot pressed for about 1 hour to about 8 hours.

14. The method of claim 10, wherein the powder bed is hot pressed at a temperature ranging between about ½ the melting point of the powder bed material to about 100° below the melting point, and at a pressure of about 0.5 to about 3 ksi for about 1 hour to about 8 hours.

15. The method of claim 10, wherein the metal plates have a thickness between about 0.3 inch to about 0.6 inch.

16. The method of claim 10, wherein the pressed target blank is hot isostatic pressed at a temperature between about 1000° C. to about 1600° C. and a pressure of at least about 15 ksi for at least about 3 hours.

17. The method of claim 10, wherein the metal capsule has a wall thickness between about 0.03 inch and about 0.2 inch.

18. The method of claim 10, wherein the powder bed material is selected from the group consisting of: Ti—Al alloys, Cr—Cu alloys, W—SiN alloys, Ta—Al alloys, Co—Cr alloys, and silicides.

19. The method of claim 10, wherein the average particles size of the powder bed material is in the approximate range of about 0.5 μm to about 150 μm.

20. A method of fabricating high density sputter targets, comprising the steps of:
    pouring a powder between two metal plates in a metal capsule while vibrating the metal capsule to achieve a packed target blank having a packing density of about 30% to about 50% of theoretical and a ratio of radius to thickness of at least about 5; and
    hot isostatic pressing the packed target blank in the metal capsule to achieve a near net-shaped sputter target having a density of at least 96% of theoretical and a ratio of radius to thickness of at least about 5.

21. The method of claim 20, wherein the metal plates have a thickness between about 0.3 inch to about 0.6 inch.

22. The method of claim 20, wherein the pressed target blank is hot isostatic pressed at a temperature between about 1000° C. to about 1600° C. and a pressure of at least about 15 ksi for at least about 3 hours.

23. The method of claim 20, wherein the metal capsule has a wall thickness between about 0.03 inch and about 0.2 inch.

24. The method of claim 20, wherein the powder bed material is selected from the group consisting of: Ti—Al alloys, Cr—Cu alloys, W—SiN alloys, Ta—Al alloys, Co—Cr alloys, and silicides.

25. The method of claim 20, wherein the average particles size of the powder bed material is in the approximate range of about 0.5 $\mu$m to about 150 $\mu$m.

* * * * *